United States Patent [19]

Deeken

[11] Patent Number: 4,787,588
[45] Date of Patent: Nov. 29, 1988

[54] ARRANGEMENT FOR MOUNTING A HOUSING AT A CARRIER, PARTICULARLY FOR MOTOR VEHICLES

[75] Inventor: Helmut Deeken, Regensburg, Fed. Rep. of Germany

[73] Assignee: Siemens Aktiengesellschaft, Berlin and Munich, Fed. Rep. of Germany

[21] Appl. No.: 115,897

[22] Filed: Nov. 2, 1987

[30] Foreign Application Priority Data

Nov. 28, 1986 [DE] Fed. Rep. of Germany ....... 3640667

[51] Int. Cl.$^4$ ............................................. E04G 5/06
[52] U.S. Cl. .................................. 248/222.1; 361/388
[58] Field of Search ............... 248/222.1, 223.3, 225.1, 248/225.2; 361/388, 427, 331, 420; 174/52 PE; 211/26

[56] References Cited

U.S. PATENT DOCUMENTS

| | | | |
|---|---|---|---|
| 1,898,835 | 2/1933 | Henderson | 248/222.1 X |
| 2,784,931 | 3/1957 | Martin . | |
| 3,711,748 | 1/1973 | Dietz | 361/427 X |
| 4,020,951 | 5/1977 | Wurthner | 248/222.1 X |
| 4,031,796 | 6/1977 | Wilkes | 248/222.1 X |
| 4,157,583 | 6/1979 | Basmajian et al. . | |
| 4,414,605 | 11/1983 | Chino | 361/388 |
| 4,636,580 | 1/1987 | Neidig | 361/388 X |
| 4,657,325 | 4/1987 | Marks | 361/388 X |

FOREIGN PATENT DOCUMENTS 2942936 5/1981 Fed. Rep. of Germany .

Primary Examiner—J. Franklin Foss

[57] ABSTRACT

A housing is clamped to a carrier with a clamping mechanism, this carrier, for example, being connected to a car body of a motor vehicle. The position of the housing at the carrier is determined by a guide mechanism that is composed of a guide channel at the carrier and of a guide part at the housing. In addition to the guide part the clamp mechanism has a tension means which is composed of a seated rocking lever and a connector piece. A plurality of guide channels for mounting a plurality of housings can be arranged at the carrier parallel to one another.

8 Claims, 3 Drawing Sheets

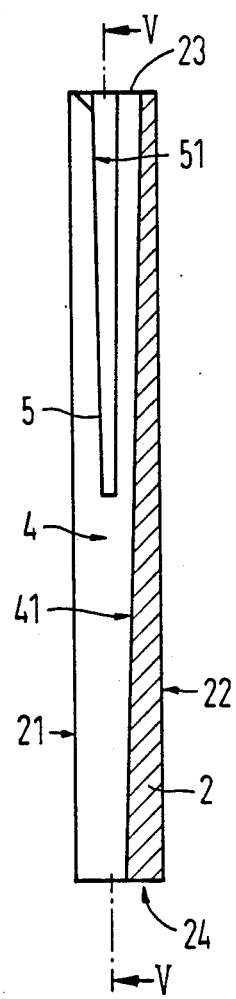
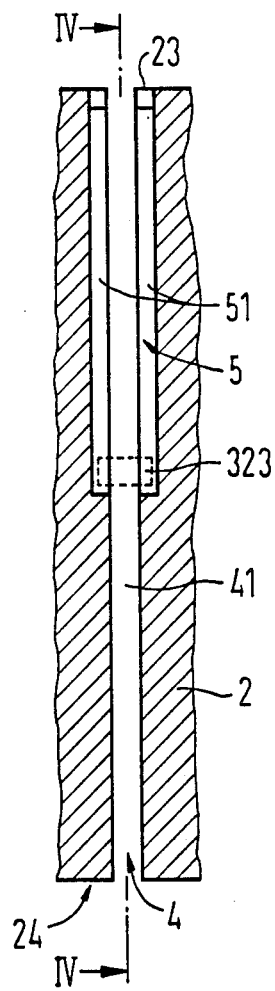

ARRANGEMENT FOR MOUNTING A HOUSING AT A CARRIER, PARTICULARLY FOR MOTOR VEHICLES

BACKGROUND OF THE INVENTION

1. Field of the Invention

The invention is directed to an arrangement for mounting at least one housing having a bearing side at a carrier which acts as a cooling member and has a bearing surface including a guide means with which the position of the housing at the carrier is determined and including a clamping mechanism with which the housing has its bearing side clamped against the bearing surface of the carrier.

2. Description of the Prior Art

Electronic assemblies (anti-locking system, motor control, lock system, navigation system) are being increasingly utilized in motor vehicles. These each being accomodated in a separate housing that is secured to a carrier in the car body. The connection between every housing and the carrier must thereby be designed such that the high demands made of the operating reliability are met and such that a reliable heat transmission for eliminating the heat generated by the assembly is guaranteed.

German published application No. 29 42 936 discloses an arrangement of this type wherein at least one housing is secured to the carrier with a screw-type connection. An adequate heat transmission between the housing and the carrier is thereby established but a relatively large amount of space is required for mounting and dismantling and the loosening and fastening of the screw-type connection is involved and time-consuming.

SUMMARY OF THE INVENTION

An object of the invention is to provide an arrangement of the type initially described such that a simpler mounting and dismantling of the housing is possible, even given less space available, without the aforementioned demands made of reliability of the fastening and of the heat transmission being negatively affected.

This object is achieved by means of a guide channel in the bearing surface of the carrier serving as a guide means in combination with a guide part at the bearing side which engages into the guide channel and the clamp mechanism is arranged at a side of the housing which proceeds at a right angle relative to the bearing side and is composed of the guide part and of a tension means which is connected to the guide part.

In accord therewith, the guide means is composed of a guide part at a bearing side of the housing and of a guide channel in the bearing surface of the carrier into which guide channel the guide part engages. The latter can be designed extremely narrow so that an optimum heat transmission is established at the effective contacting surface between housing and carrier. At the same time, the guide part is a part of the easily releasable clamping mechanism which also comprises a tension or traction means which is connected to the guide part.

The arrangement of the invention can also be utilized when the available space is so restricted that the arrangement is accessible from only one side which lies at a right angle relative to the carrier plane. For example, given the restricted space available in the motor compartment of a motor vehicle, this can be exploited. The invention enables a plurality of housings to be accommodated at the carrier on a tight space abutting against one another, this being effected by the three-dimensional arrangement of clamp mechanism and guide means.

The tension or traction means of the clamping mechanism is preferably composed of a rocker lever and of a connecting member which connects the guide part to the rocking lever.

A tie bar or pulling strap can, for example, serve as connecting member. A simple tension spring is preferably employed. The lever linkage of the clamping mechanism composed of rocking lever, tension spring and guide part enables a relatively small external force to be converted into an extremely high pressing force between the housing and the carrier. The pressing force should be greater than 300 Newtons in order to realize a high operating reliability and an optimum heat transmission between housing and carrier. The clamping mechanism preferably has a pre-stressing mechanism with which it is held at the housing with adequate stability when the housing is not inserted. The guide part is thus also adequately fixed at the housing in order to reliably guide it in the guide channel when the guide part is inserted.

An exact guidance is of special significance when, according to an embodiment of the invention, a traditional plug-type connection is provided between housing and carrier. Such a connection additionally facilitates the replacement of an assembly by a replacement assembly during maintenance work.

A further advantageous embodiment is that the guide part is seated at the carrier. For the purpose, it has a bearing part with which it is arranged in an abutment in the carrier.

A plurality of guide channels can also be arranged side-by-side in the carrier in order to be able to secure a correponding plurality of housings thereto, even housings having different sizes. In this way, all electronic assemblies of a motor vehicle can be arranged on a single carrier at one location of the car body. A better space exploitation and a simpler structure of the cable harness result therefrom.

BRIEF DESCRIPTION OF THE DRAWINGS

The invention shall be set forth in greater detail below with reference to an exemplary embodiment. Shown are:

FIG. 4 is a section through the carrier along the line IV in FIG. 5.

FIG. 5 is a section through the carrier comprising guide channel and bearing channel along the line V in FIG. 1 and in FIG. 4.

DESCRIPTION OF THE PREFERRED EMBODIMENTS

Figure 1:
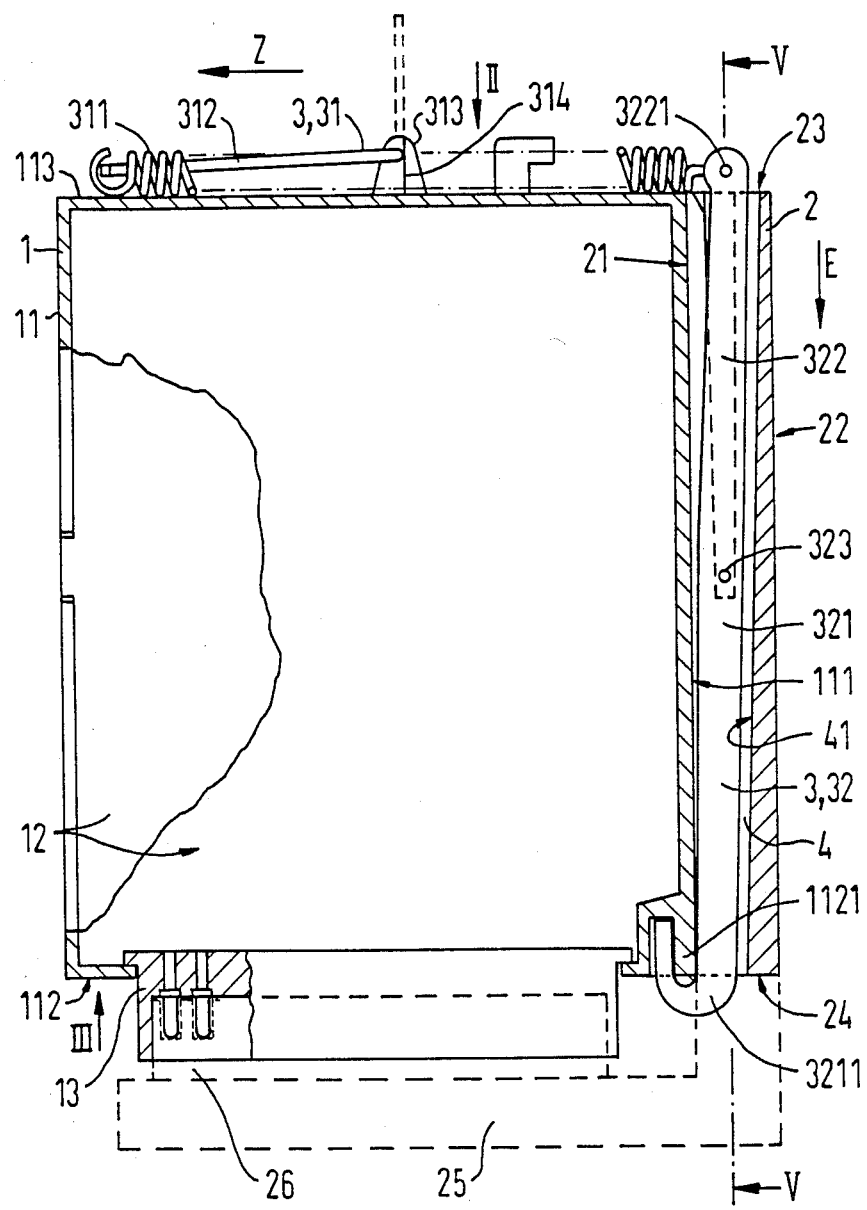
FIG. 1 is a section through an arrangement comprising carrier and housing mounted thereat, along the line I—I in FIG. 2 and in FIG. 3.
Figure 2:
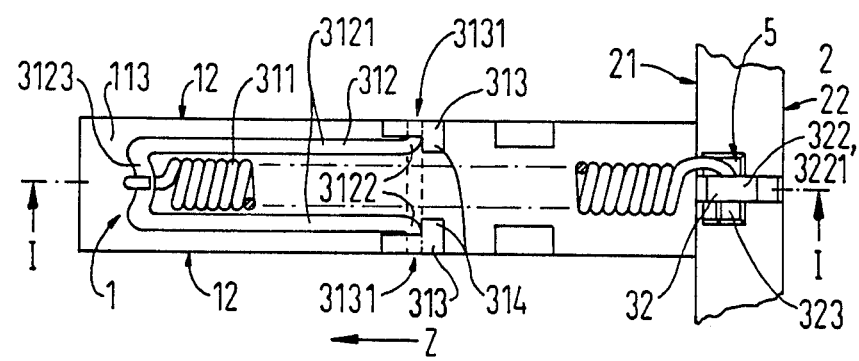
FIG. 2 is a view of the arrangement in the direction of the arrow II in FIG. 1.
Figure 3:
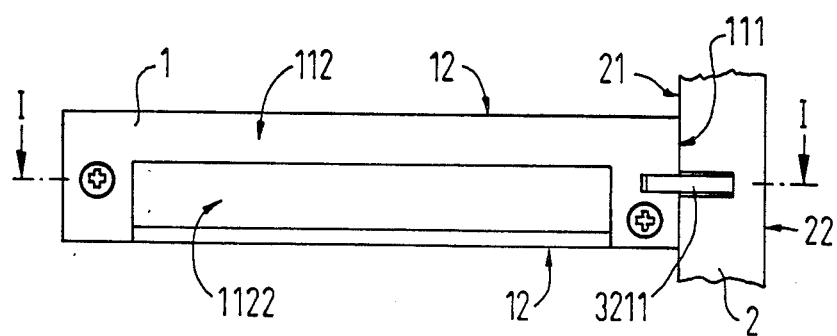
FIG. 3 is a view of the arrangement in the direction of the arrow III in FIG. 1 without the plug-in mechanism.

A metallic housing 1 comprises a rectangular frame 11 which is composed of four narrow wall parts having a relatively slight wall thickness. Two rectangular, planar cover parts 12 of identical size are secured to the frame 11, these forming the housing 1 together with the frame 11. At its outside, the frame 11 has a bearing side 111 and, at right angles thereto, has a clamping side 113 and a connection side 112. A plug opening 1122, into which a plug mechanism 13 comprising a plurality of pin rows is screwed, is provided at the connection side 112. The frame has a pressure part 1121 at the connection side 112 adjacent to the bearing side 111 (FIG. 1).

Heat-producing component parts are arranged such in the housing that an optimally good heat transmission to the inside of the bearing side 111 is established. A solid carrier 2 is fabricated of a material having good thermal conductivity, for example of aluminum, and has a backside 22 with which it can be secured, for example, to a body part of a motor vehicle. Parallel to the backside 22, the carrier 2 has a bearing surface 21 against which the bearing side 111 of the housing 1 is pressed when the housing 1 is clamped to the carrier 2 in a clamping position (FIG. 1). As part of a guide mechanism, a guide channel 4 having a floor 41 is arranged in the carrier 2, this guide channel 4 proceeding continuously from a front side 23 of the carrier up to a backside 24 of the carrier 2. The guide channel 4 is open toward the bearing surface 21. The depth of the guide channel 4, which is equal to the distance between the bearing surface 21 of the carrier 2 and the floor 41, decreases on a straight line from the front side 23 of the carrier to its backside 24. A bearing channel 5 which crosses the guide channel 4 at a right angle proceeds in the carrier 2, beginning at the front side 23 of the carrier and extending into the carrier 2 roughly up to the middle of the bearing surface 21. It has two slanting wedge surfaces 51 whose distance from the bearing surface 21 increases toward the middle of the carrier 2.

The bearing channel serves as an abutment for a bearing part 323 of a clamp mechanism 3. The latter is composed of a tension or traction mechanism 31 and of a guide part 32 composed of spring steel which is guided and seated in the guide channel 4 at the carrier 2. The guide part 32 is fashioned as a two-armed lever having a respective tension leg 321, 322 at each side of the bearing part 323 and projects out of the guide channel 4 at both sides. That end of the tension leg 322 projecting at the tension or clamping side 113 carries a coupling member 3221; the end of the other tension leg 321 carries a U-shaped tension hook 3211 which embraces the pressure part 1121 at the connection side 112 of the housing 1. The width of the guide part 32 essentially corresponds to the width of the guide channel 4; the height is significantly larger than the width in order to thus achieve a high flexural stiffness.

The bearing part 323 is pin-shaped and fits into the bearing channel 5 where it is supported against the wedge surfaces 51 when the clamp mechanism 3 is tightened. The tension or traction mechanism 31 is composed of a connecting member in the form of a helical tension spring 311, of a rocking lever 312, and of a lever bearing for the rocking lever 312 which is arranged in a bearing member 313 at the clamping side 113 of the housing 1.

The rocking lever 312 has an essentially U-shaped design and comprises a yoke-shaped connecting part 3123 between two leg 3121 proceeding parallel to one another; at their free ends, the latter have relatively short bearing legs 3122 bent off at right angles which project toward the cover parts 12 from the legs 3121. Each of the bearing members 313 lies adjacent to the cover part 12 at the clamping side 113 of the housing 1 and has a bearing bore 3131 in which the bearing leg 3122 is rotatably seated. The bearing members 313 each have a projecting detent 314 against which the rocking lever 312 strikes in a prestressing position (shown with broken lines). The tension spring 311 has its spring ends hooked to the tension or traction leg 322 of the guide part 32 between the connecting part 3123 of the rocking lever 312 and the coupling member 3221.

Before the assembly of carrier 2 and housing 1, the clamping mechanism 3 at the housing 1 is situated in the prestressing position: the guide part 32 is thereby arranged along the bearing side 111 of the housing 1 and has the tension hook 3211 embracing the pressure part 1121 at the housing 1. The coupling member 3221 at the other end of the guide part 32 is connected to the rocking lever 312 via the slightly tensed tension spring 311. As a result thereof, the guide part 32 is drawn against the bearing side 111 and the rocking lever 312 is drawn against the detents 314 and, thus, the clamp mechanism 3 together with the guide part 32 is held at the housing 1. For connecting the housing 1 and carrier 2, the housing 1 is placed on the carrier 2 such that the guide part 32 engages into the guide channel 4 and the bearing part 323 engages into the bearing channel 5 of the carrier.

Given further displacement of the housing 1 in the direction toward the final position shown in FIG. 1 in insertion direction E, the bearing part 323 slides along the wedge surfaces 51 of the bearing channel 5 until the housing 1 has assumed its final position according to FIG. 1. When the rocking lever 312 is moved from the pre-stressing position indicated with broken lines in FIG. 1 into the illustrated clamping position in clamping direction Z the tension spring 311 and the guide part 32 are tensed. The latter thereby moves somewhat in a counterclockwise direction around the bearing part 323 and its tension hook 3211 also pulls the housing 1 against the carrier 2 at its other end. Given identical length of the tension legs 321, 322, the forces between housing 1 and carrier 2 are thereby identical. In the clamping position, the tension spring 311 attacks such at the rocking lever 312 that the latter is pulled against the clamping side 113 of the housing 1, i.e. is secured in the clamped position. To this end, the bearing point of the rocking lever 312 is arranged at such a distance from the clamping side 113 of the housing 1 that the force line of the tension spring 311 proceeds between the bearing point and the clamping side 113 of the housing 1. The rocking lever 312 therefore automatically moves into the clamped position when it is rotated beyond a tilting point due to the action of an external force in clamping direction Z. Inversely, the rocking lever 312 automatically moves into the pre-stressing position when it is moved beyond the tilting point in the opposite direction.

A cooperating plug 26 to which the plug mechanism 13 at the housing 1 is allocated can be arranged at the backside 24 of the carrier 2 via a fastening part 25.

As is apparent from the foregoing specification, the invention is susceptible of being embodied with various alterations and modifications which may differ particularly from those that have been described in the preceding specification and description. It should be understood that I wish to embody within the scope of the patent warranted hereon all such modifications as reasonably and properly come within the scope of my contribution to the art.

I claim as my invention:

1. An arrangement for mounting at least one housing comprising a bearing side at a carrier which acts as a cooling member and has a bearing surface comprising a guide means with which the position of the housing at the carrier is determined, and comprising a clamping mechanism with which the housing has its bearing side clamped against the bearing surface of the carrier, characterized in that a guide channel in the bearing surface of the carrier serves as guide means in combination with a guide part at the bearing side which engages into the guide channel; and the clamp mechanism is arranged at a side of the housing which proceeds at a right angle relative to the bearing side and is composed of the guide part and of a tension means which is connected to the guide part.

2. An arrangement according to claim 1, characterized in that the guide part is fashioned as a two-armed lever having a respective tension leg at each side of a bearing part;

an abutment for the bearing part is arranged transversely relative to the guide channel in the carrier;

a tension hook is situated at the free end of the one tension leg and a coupling member is situated at the end of the other tension leg;

the tension hook overlaps a pressing part of the housing and the tension means comprises a rocking lever which is flexibly connected to the coupling member via a connector piece and is seated such at the housing that it is held in a clamped position by the clamping force of the clamp mechanism.

3. An arrangement according to claim 2, characterized in that the connector piece is a tension spring.

4. An arrangement according to claim 3, characterized in that the rocking lever is blocked in a pre-stressing position by a detent, the rocking lever and the guide part being tensed relative to one another with slight force by a tension spring in this pre-stressed position and being thereby held against the housing.

5. An arrangement according to claim 4, characterized in that a plurality of guide channels proceed parallel to one another in the carrier.

6. An arrangement according to claim 5, characterized in that at least two housings each comprising an identical guide mechanism and clamping mechanism are secured to the carrier.

7. An arrangement according to claim 5 or 6, characterized in that every housing has a plug-in mechanism for connection to a cooperating plug.

8. An arrangement according to claim 7, characterized in that the cooperating plug is secured to the carrier.

* * * * *